(12) United States Patent
Ito et al.

(10) Patent No.: US 8,102,715 B2
(45) Date of Patent: Jan. 24, 2012

(54) POWER-OFF APPARATUS, SYSTEMS, AND METHODS

(75) Inventors: Yutaka Ito, Tokyo (JP); Adrian J. Drexler, Meridian, ID (US); Brandi M. Jones, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/100,947

(22) Filed: May 4, 2011

(65) Prior Publication Data

US 2011/0205813 A1    Aug. 25, 2011

Related U.S. Application Data (60) Continuation of application No. 12/698,808, filed on Feb. 2, 2010, now Pat. No. 7,940,569, which is a division of application No. 11/936,628, filed on Nov. 7, 2007, now Pat. No. 7,656,720.

(51) Int. Cl.
*G11C 11/34* (2006.01)
(52) U.S. Cl. ............... 365/185.18; 365/189.09; 365/222
(58) Field of Classification Search ............. 365/185.18, 365/189.09, 222
See application file for complete search history.

(56) References Cited

U.S. PATENT DOCUMENTS

| | | | |
|---|---|---|---|
| 5,365,487 A | 11/1994 | Patel et al. | |
| 5,798,976 A | 8/1998 | Arimoto | |
| 5,953,246 A | 9/1999 | Takashima et al. | |
| 6,246,625 B1 | 6/2001 | Yamagata et al. | |
| 6,519,191 B1 * | 2/2003 | Morishita | 365/189.09 |
| 6,990,031 B2 | 1/2006 | Hashimoto et al. | |
| 6,992,946 B2 | 1/2006 | Ooishi | |
| 7,656,720 B2 | 2/2010 | Ito et al. | |
| 2009/0116328 A1 | 5/2009 | Ito et al. | |
| 2010/0135065 A1 | 6/2010 | Ito et al. | |

* cited by examiner

*Primary Examiner* — Jason Lappas
(74) *Attorney, Agent, or Firm* — Schwegman, Lundberg & Woessner, P.A.

(57) ABSTRACT

Apparatus, methods, and systems are disclosed, including those that are to prevent a bias voltage from rising to a higher level than a storage node voltage as the bias voltage transitions to a ground level. For example a first voltage generator may be utilized to generate a bias voltage to bias a transistor in a memory cell in a memory array. A second voltage generator may be utilized to generate an plate voltage. The memory cell may include a transistor on a substrate and a capacitor. The capacitor connects from a drain of the transistor to the plate voltage. The storage node voltage is located at the drain of the transistor. A power controller may provide an off signal to the first and second voltage generators. The bias voltage may then transition to ground from a voltage less than zero volts. The rate of the bias voltage rise to ground is such that the bias voltage is maintained at less than or equal to the storage node voltage during the transition time period.

20 Claims, 13 Drawing Sheets

POWER-OFF APPARATUS, SYSTEMS, AND METHODS

RELATED APPLICATION

This application is a continuation of U.S. application Ser. No. 12/698,808, filed Feb. 2, 2010 now U.S. Pat. No. 7,940,569, which is a divisional application of U.S. application Ser. No. 11/936,628 filed on Nov. 7, 2007, now issued as U.S. Pat. No. 7,656,720, which applications are incorporated herein by reference in their entirety.

BACKGROUND

Dynamic random access memory (DRAM) is a type of random access memory that may be constructed to store each bit of data in a separate capacitor within an integrated circuit. The charge on the capacitor is typically refreshed to maintain the data, since real capacitors leak charge.

DRAM may be arranged in a rectangular array of cells, with one capacitor and one or more transistors per cell. A read operation proceeds as follows: the row of the selected cell is activated, turning on the transistors and connecting the capacitors of that row to sense lines. The sense lines lead to the sense amplifiers, which distinguish signals that represent a stored 0 or 1. The amplified value from the appropriate column is then selected and connected to the output. At the end of a read cycle, the row values are restored to the capacitors, depleted during the read operation. During a write to a particular cell, the entire row is read out, one value is changed, and then the entire row is written back in. Thus, a write operation is accomplished by activating the row and connecting the values to be written to the sense lines, which charges the capacitors in that row to the desired values.

Typically, manufacturers specify that each row should be refreshed every 64 milliseconds (ms) or less, according to various Solid State Technology Association (formerly known as Joint Electron Device Engineering Council (JEDEC)) standards. Refresh logic is commonly used with DRAMs to automate the periodic refresh. Some systems refresh every row in a tight loop that occurs once every 64 ms. Other systems refresh one row at a time—for example, a system with $2^{13}$=8192 rows might refresh memory at a rate of one row every 7.8 microseconds (μs) (64 ms/8192 rows).

DETAILED DESCRIPTION

Figure 1:
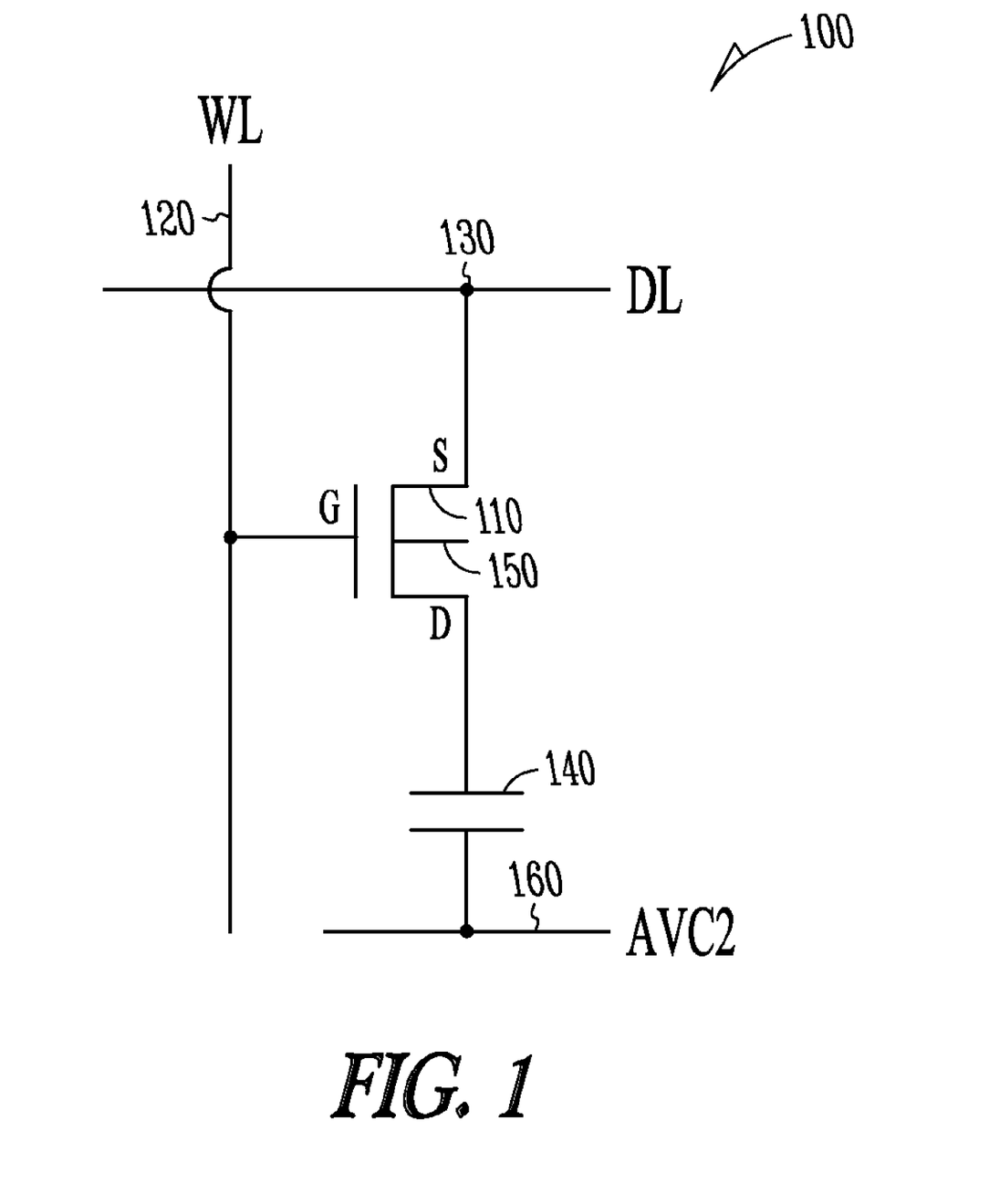
FIG. 1 is a schematic diagram of a prior art DRAM memory cell.

FIG. 1 is a schematic diagram of a prior art DRAM memory cell 100. DRAM memory cell 100 comprises a transistor 110 having a gate (G), a drain (D) and a source (S). The gate (G) is connected to a word line 120 to activate the transistor 110. The source (S) of transistor 110 is connected to a digit line 130 that provides the data signal DL to be stored in DRAM memory cell 100. The digit line 130 may also provides the data output when data is retrieved. The input from data line 130 will be either a high signal (e.g., "1") or a low signal (e.g., "0"). The high signal may be greater than one half of a supply voltage. The low signal may be less than one half of the supply voltage. In some embodiments, the voltage polarity may be reversed. A data input bit provided on the digit line 130 is stored on a capacitor 140 that is connected between a plate voltage 160 (the terms plate voltage and array voltage may be used interchangeably and will have the same meaning) and the drain (D) of transistor 110. A bias voltage 150 is applied to bias the transistor 110.

Figure 2:
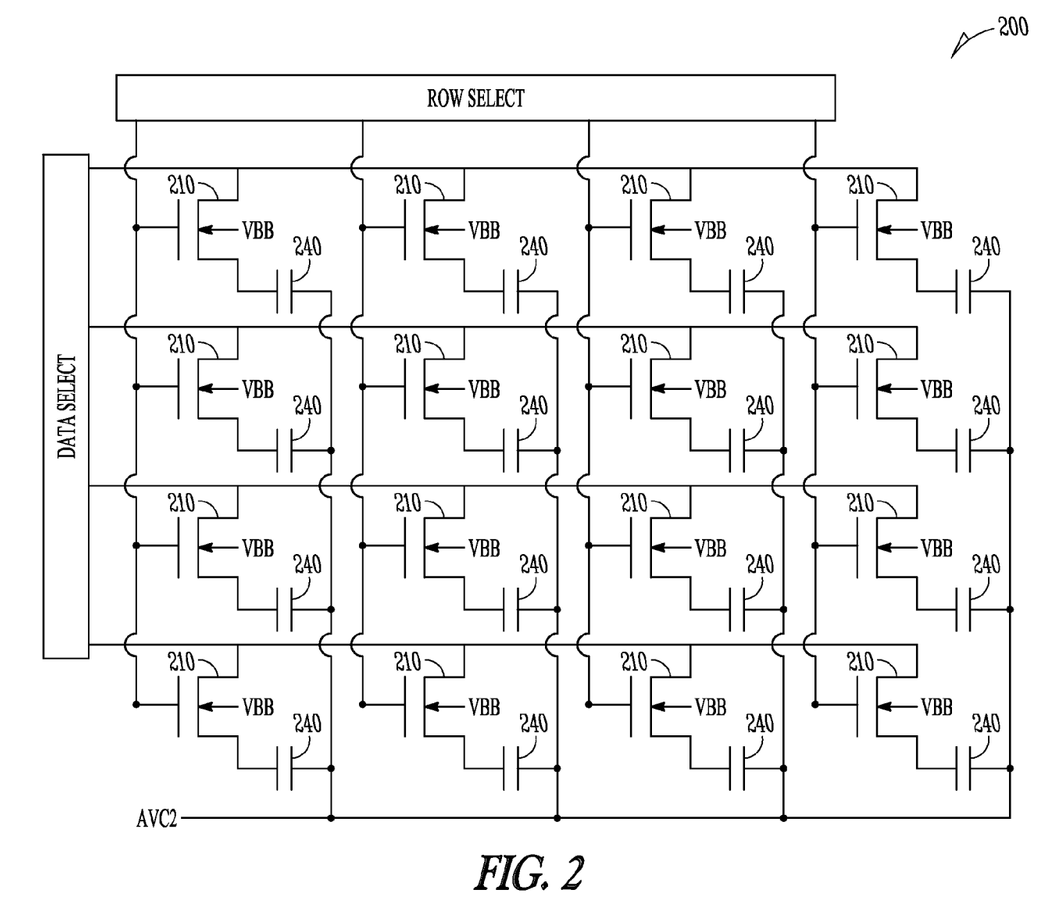
FIG. 2 is a schematic diagram of a prior art DRAM four by four cell memory circuit.

FIG. 2 is a schematic diagram of a prior art DRAM four by four cell memory circuit 200. DRAM, as shown here, may be arranged in a square array of one capacitor and transistor per cell. FIG. 2 shows a simple example with only 4 by 4 cells; however, a DRAM may comprise an unlimited number of cells in length and width.

Here, each DRAM cell comprises a transistor 210 and a capacitor 240. A bias voltage VBB is applied to the transistors 210 and a plate voltage, AVC2, is provided to the capacitors 240. A read operation proceeds as follows: the row of the selected cell is activated by setting the Row Select output high for a selected row of DRAM cells, turning on the transistors, and connecting the capacitors of that row to the Data Select lines. The Data Select lines lead to sense amplifiers (not shown) that distinguish signals representing a stored 0 or 1. At the end of a read cycle, the row values are restored to the capacitors 240, depleted during the read operation. A write operation is accomplished by activating the desired row and connecting the values to be written to the data select lines, charging the capacitors 240 to the desired values.

In low-power data retention mode, a power-off scheme may be employed between burst-refresh intervals to reduce the current consumed, and to improve refresh characteristics. This is done by stopping internal voltage generators, and selecting predetermined dc values.

Figure 3:
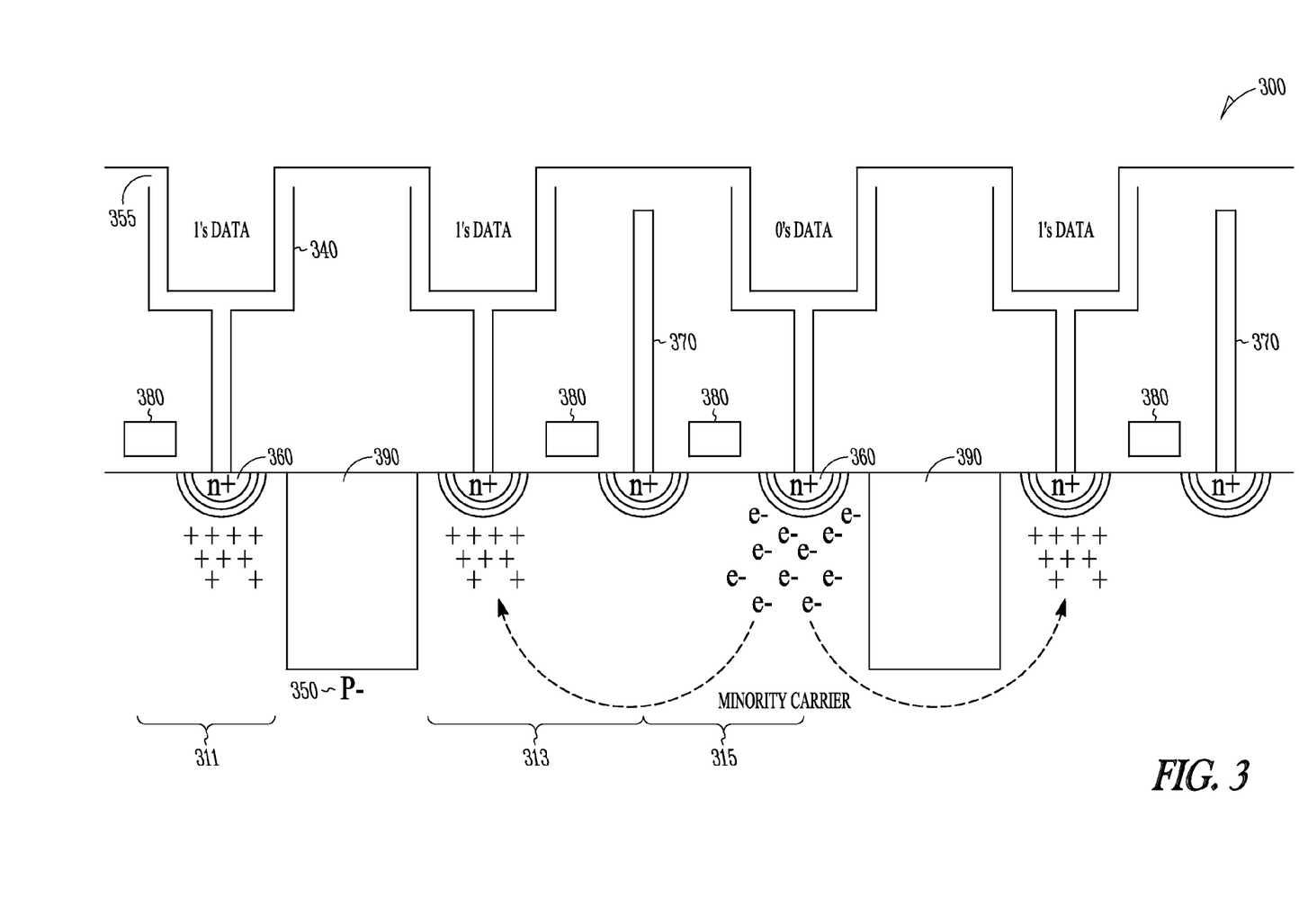
FIG. 3 illustrates multiple DRAM cells at a sub-micron level on a substrate.

FIG. 3 illustrates multiple DRAM cells at a sub-micron level on a substrate 300. A capacitor 340 is deposited or laid out in a Y-shaped receptacle form to increase the overall capacitance achieved in the space provided. A plate voltage 355 is applied to the substrate 300 at one end of the capacitor 340. A drain 360 for a transistor 311 is located at the other end of capacitor 340. A source 370 of the transistor is shared between two transistors, such as transistors 313 and 315, in this example, and gates 380 are located as shown in the substrate 300. A bias voltage 350 is applied to the substrate to bias the transistor. Insulators 390 isolate the transistor drains.

As the power-off mode is initiated to turn off all internal power generators, at a sub-micron device level, the inventors have discovered that memory may become sensitive to minority carrier leakage. Typically, if a lower plate voltage and digit line voltage are used that are slightly less than half the supply voltage, margin may be improved. Margin may be characterized as the retention ability of the storage node. As margin improves, the timed refresh cycles do not need to occur as frequently. Margin will improve as minority carrier leakage is reduced. In addition, the inventors have noticed that minority carrier leakage sensitivity may increase because the plate voltage and the digit line voltage are set close to half of the supply voltage. Even if a level of half the supply voltage is employed for plate and digit line voltages, plate noise does not seem to disappear completely during active operation. So, even if the plate voltage level is fixed to half the supply voltage level in the power-off mode, many storage-nodes in the array might have negative voltages. Although the negative storage node voltage might be in the range of 100 millivolts, refresh characteristics in a sub-micron device would still be decreased due to minority carrier leakage.

Due to a tight, active pre-charge cycle and EQ (equilibrium) operation, the plate voltage and digit line voltages become close to half the supply voltage during the burst-refresh cycle. The EQ operation equilibrates the digit lines. Currently, plate voltages and digit line voltages are trimmed to lower than half the supply voltage level. The short EQ operation time period does not allow enough time to equilibrate the digit lines back to the trimmed voltage level (lower than half the supply voltage). Instead, the digit lines are equilibrated to half the supply voltage level. As the power-off mode is entered, the plate voltage and digit line voltages toggle to a voltage level lower than half of the supply voltage (e.g., to the trimmed voltage level). As a result, plate-bump may occur, shifting the storage node voltage down by the same voltage level. Also, during power-off mode, the bias voltage generator may be stopped to reduce current, while the bias voltage is set to ground or zero volts to improve refresh characteristics. The inventors have found that when the bias voltage is greater than the storage node voltage located at the drain of the transistor, minority carrier leakage may occur.

Figure 4:
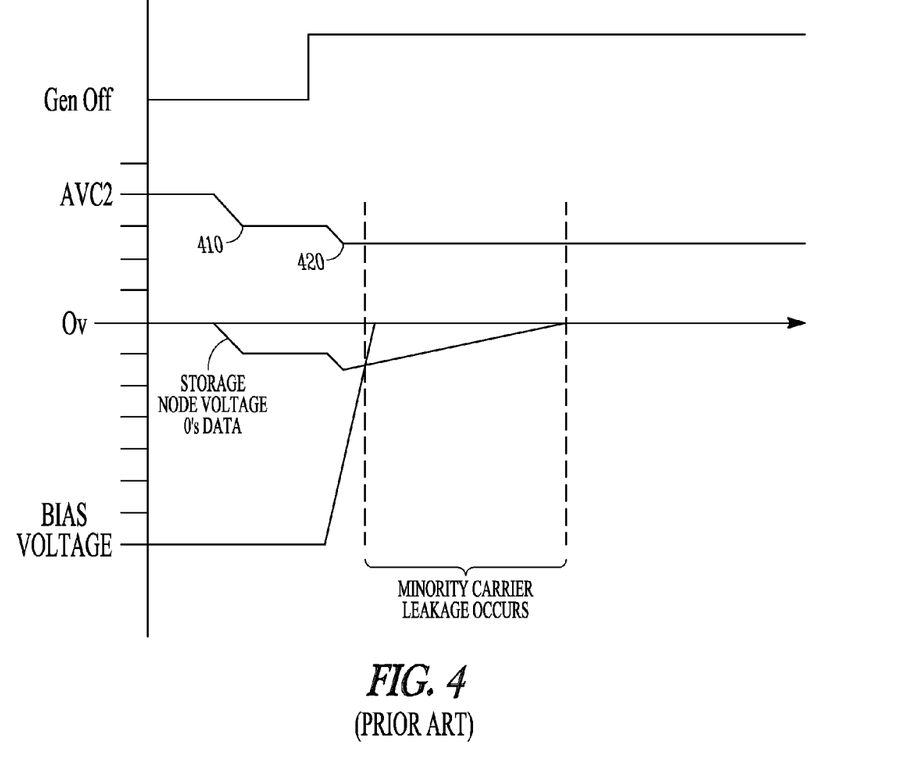
FIG. 4 is a timing diagram of a prior art DRAM cell when power-off is initiated.

FIG. 4 is a timing diagram of a prior art DRAM cell when power-off is initiated. When plate-bump occurs at a storage node with a 0 bit, the storage node voltage becomes slightly more negative, and the bias voltage may become greater than the storage node voltage as the bias voltage transitions to zero volts at power-off. During the time when the bias voltage is greater than the storage node voltage, minority carrier leakage may occur. In addition, the plate voltage line may be noisy, further lowering the storage node voltage. It should be noted that while zero volts and ground are used for simplicity in several examples herein, any reference voltage may be used that is either higher or lower than zero volts. For example instead of zero volts, the DRAM cell may be designed to use five volts as a reference voltage, and the bias voltage might be designed to transition to five volts instead of ground.

As illustrated in FIG. 3, the minority carrier leakage may cause a data storage node storing a "0" to leak electrons to nearby data storage node storing a "1", decreasing charge quantity (i.e. lowering the voltage stored at the data storage node where the "1" is stored). Also, the charge quantity itself for nodes storing a "0" may decrease during this process (i.e. the electrons from the node storing a "0: can migrate to the node storing a "1"). The result is that holes in nodes storing a "1"as data, at the drains of the transistors, are filled with electrons from nodes storing a "0" as data at the drains of the transistors. As the quality of storage deteriorates, the data stored as a "1" may no longer read as a "1" and may instead be seen as a "0", causing a loss of data. In addition, as the number of stored (apparent) "0" data values increases in the memory-array, additional minority carrier leakage may occur during subsequent power-off and burst-refresh cycles. When the system reads the data during a refresh cycle, the data will be refreshed to the data that was read, as a result, the refresh cycle may fully convert the data from a 1 to a 0.

As seen in FIG. 4 when the generator off signal Gen Off is received, the plate voltage AVC2 may bump down slightly. The first voltage bump 410 is due to the burst refresh ending. Therefore, the plate voltage AVC2 may be pulled down to a trimmed level lower than half the supply voltage level. The second voltage bump 420 is due to the signal Gen Off separating the plate voltage AVC2 from the digit line voltage and decreasing the load on the plate voltage AVC2. Since the voltage across a leaking capacitor does not usually diminish quickly, the storage node voltage also bumps down. During a power-off operation, as the storage node voltage transitions to zero volts, the bias voltage also transitions to zero volts (e.g., when the reference voltage is ground or zero volts). When the bias voltage is greater than the storage node voltage, minority carrier leakage may occur. To prevent minority carrier leakage from occurring, the bias voltage should be maintained lower than or equal to the storage node voltage, as shown with respect to the illustrated embodiments that follow.

Figure 5:
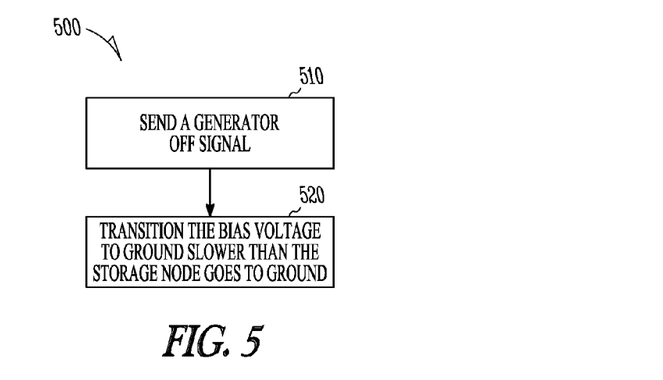
FIG. 5 is a flow diagram of a method for controlling the bias voltage as the DRAM cell enters into the power-off mode according to an embodiment of the invention.

FIG. 5 is a flow diagram 500 of a method for controlling the bias voltage as the DRAM cell enters into the power-off mode according to an embodiment of the invention. The method 500 may begin with activity 510, which may include sending a generator off signal to set the power control signal to off. Once the power control signal is set to off, the method 500 may continue on to activity 520, which may include transitioning the bias voltage to ground at a rate such that the bias voltage does not become greater than the voltage at the storage node.

Figure 6:
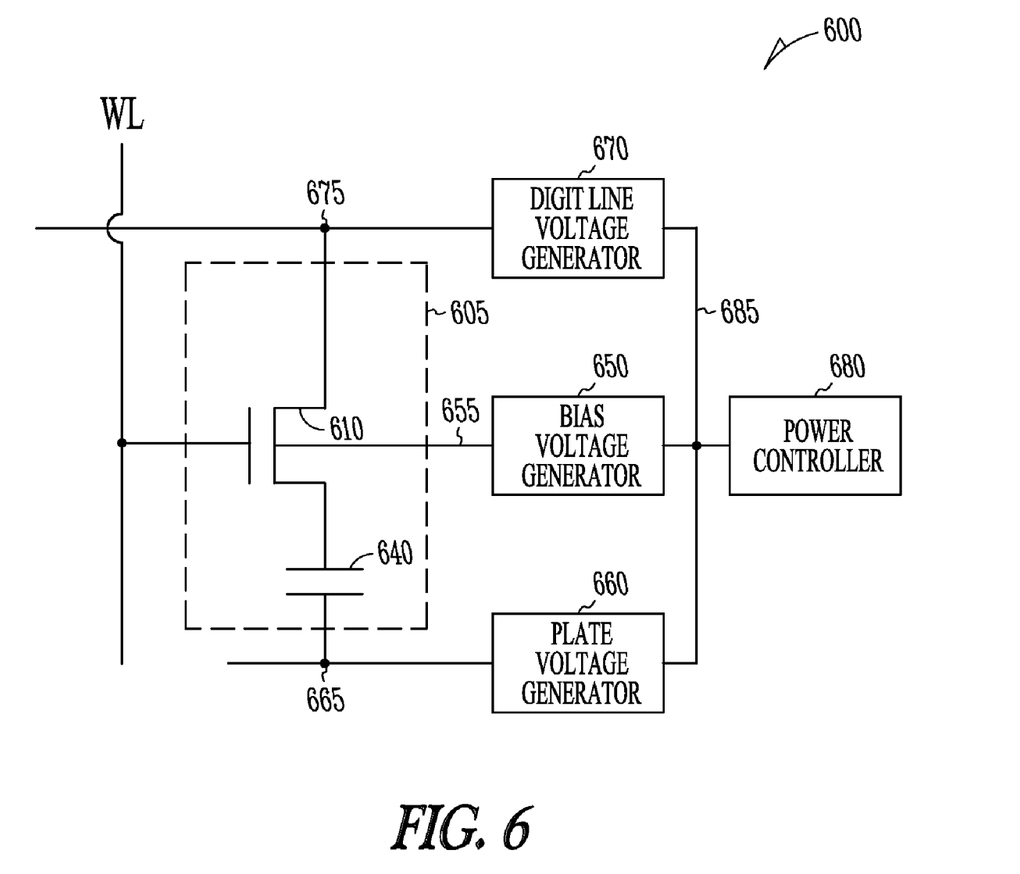
FIG. 6 is a schematic diagram of a bias voltage controller according an embodiment of the invention.

FIG. 6 is a schematic diagram of a bias voltage controller 600 according an embodiment of the invention. The embodiment may include a bias voltage generator 650 to generate a bias voltage 655 which is applied to a transistor 610. A plate voltage generator 660 generates a plate voltage 665 applied to capacitor 640. A memory cell 605 may represent one of the memory cells in an array. The memory cell 605 may include the transistor 610 on a substrate and a capacitor 640. A capacitor 640 may be connected from a drain of the transistor 610 to the plate voltage 665. The memory cell 605 may have a storage node voltage at the drain of the transistor 610. A digit line voltage generator 670 may generate digit line voltage 675.

A power controller 680 may provide an off signal 685 to the digit line voltage generator 670, bias voltage generator 650 and plate voltage generator 660. The bias voltage 655 may rise from a voltage less than zero volts to zero volts at a first rate when the power controller 680 provides the off signal to the bias voltage generator 650. The bias voltage 655 first rate of transition should be at a slope that maintains the bias voltage at less than or equal to the storage node voltage to minimize the opportunity for minority current leakage. The bias voltage 655 may be adjusted to a ground level by a voltage regulator in bias generator 650, comprising a timing circuit to generate a desired voltage transition rate for the bias voltage 655.

Figure 7:
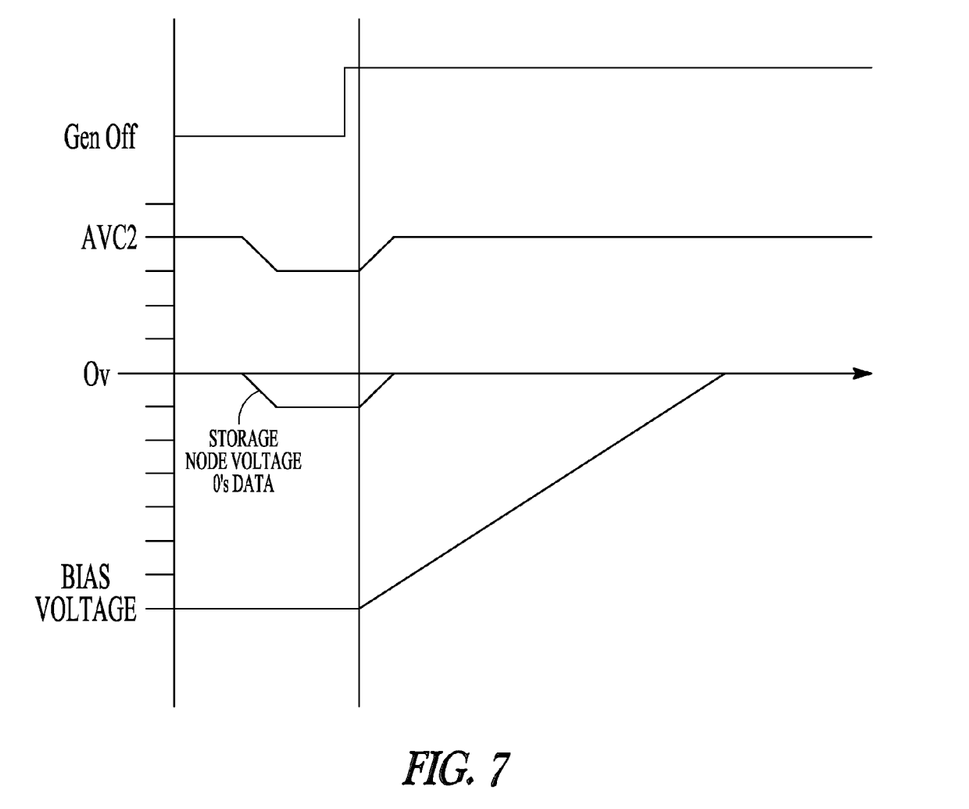
FIG. 7 is a timing diagram for operations associated with the embodiment of FIG. 6.

FIG. 7 is a timing diagram for operations associated with the embodiment of FIG. 6. As described above, when the power controller 680 of FIG. 6 provides an off signal, the bias voltage transitions to ground. By bias voltage generator 650 transitioning the bias voltage to ground at a slope as described above, it may be possible to prevent the bias voltage from being greater than the storage node voltage. Therefore, minority carrier effects may be diminished. When the Gen Off signal is set high the plate voltage AVC2, will transition to its off state. As the plate voltage AVC2 transitions, the storage node voltage also transitions to ground. Since the bias voltage transition is slowed, the bias voltage does not become greater than the storage node voltage.

Figure 8:
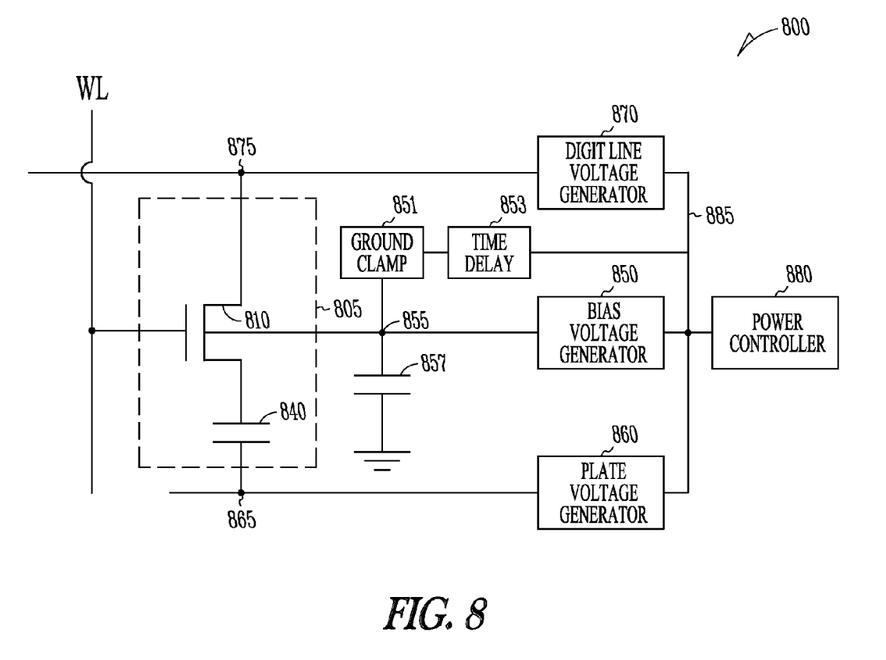
FIG. 8 is a schematic diagram of another bias voltage controller according to an embodiment of the invention.

FIG. 8 is a schematic diagram of another bias voltage controller 800 according to an embodiment of the invention. The embodiment shown here may include a bias voltage generator 850 to generate a bias voltage 855 which is applied to a transistor 810 of a memory cell 805. Memory cell 805 may represent one of the cells of an array. The memory cell 805 may include the transistor 810 on a substrate and a capacitor 840. The capacitor 840 may be connected from the drain of the transistor 810 to a plate voltage 865. The memory cell 805 may have a storage node at the drain of the transistor 810. A plate voltage generator 860 generates the plate voltage 865 that is applied to capacitor 840. A digit line voltage generator 870 generates a digit line voltage 875.

A power controller 880 may provide a generator off signal 885 to the digit line voltage generator 870, bias voltage generator 850, and plate voltage generator 860. A ground clamp 851 is connected to the output from the bias voltage generator 850 and is used to clamp the bias voltage 855 to ground. A time delay 853 may be used to delay the time at which the ground clamp 851 clamps the bias voltage 855 to ground, thus allowing the storage node voltage to transition to ground prior to clamping the bias voltage 855 to ground. In addition, to slow the rate of the bias voltage 855 transition to ground prior to clamping the voltage; one or more capacitors 857 may be connected to the output of the bias voltage generator 850.

Figure 9:
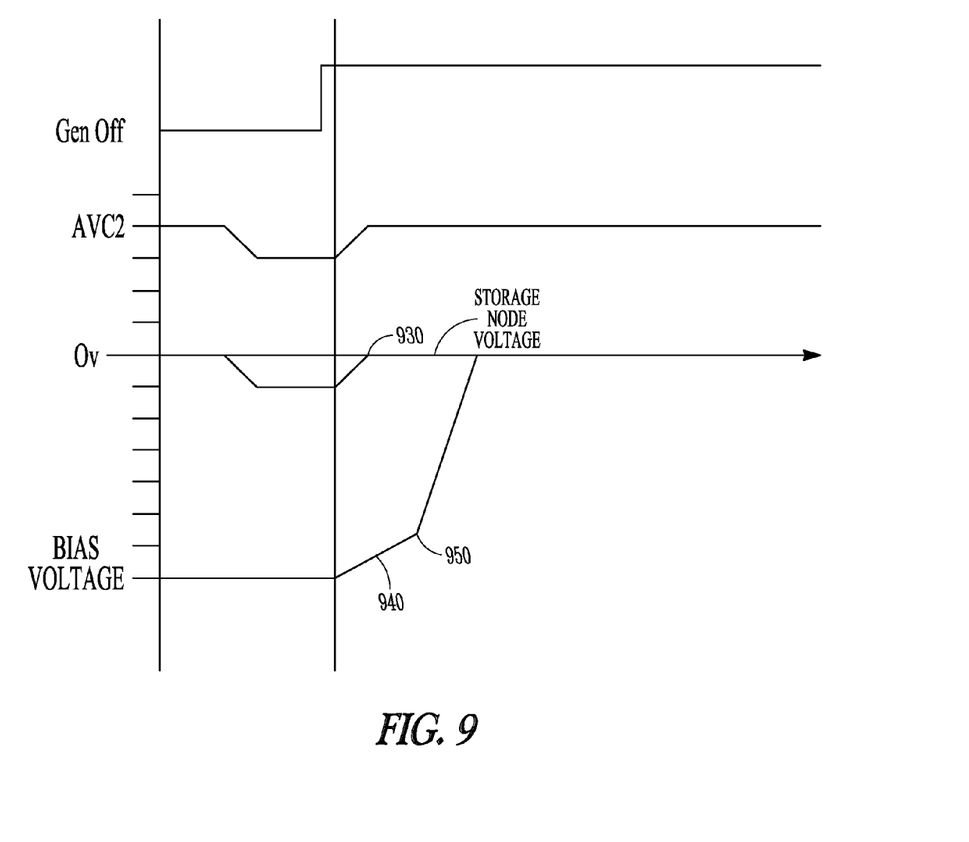
FIG. 9 is a timing diagram for operations associated with the embodiment of FIG. 8.

FIG. 9 is a timing diagram for operations associated with the embodiment of FIG. 8. As shown in FIG. 9, shortly after the Generator Off signal is sent by power controller 880 of FIG. 8, the Plate Voltage and the Storage Node Voltage increase as the Storage Node Voltage transitions to ground. The rate that the Bias Voltage transitions to ground is slowed as shown by the slope 940 of the bias voltage. The slower transition is due to the addition of capacitor 857 of FIG. 8. At point 950 after time delay 853 ends, the ground clamp 851 of FIG. 8 is engaged and the Bias Voltage transitions at a faster rate to ground. As seen at point 930, the Storage Node Voltage has already reached ground prior to point 950 when the ground clamp 851 is engaged.

Figure 10:
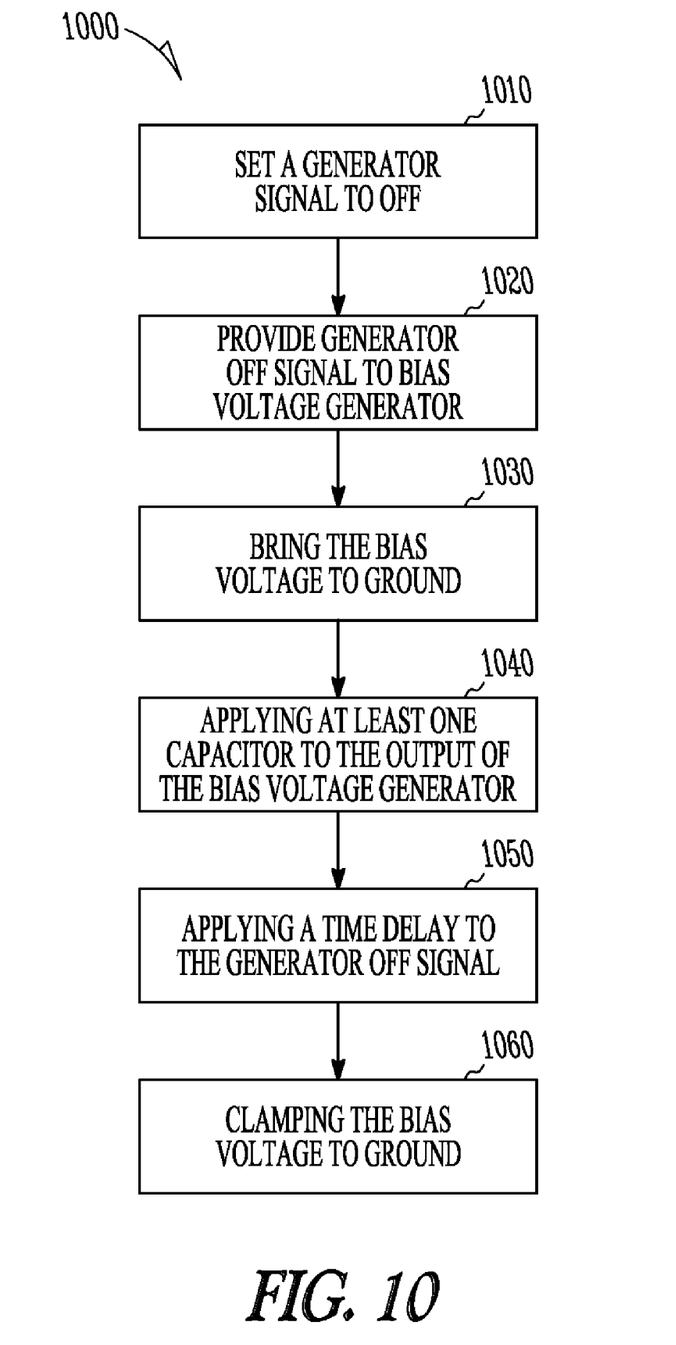
FIG. 10 is a flow diagram of a method of controlling the bias voltage as the DRAM cell enters into the power-off mode according to an embodiment of the invention.

FIG. 10 is a flow diagram 1000 of a method of controlling the bias voltage as the DRAM cell enters into the power-off mode according to an embodiment of the invention. Activity 1010 may comprise setting a generator signal to off, providing a Generator Off signal. Activity 1020 may include providing the Generator Off signal to at least a bias voltage generator, such as bias voltage generator 850 of FIG. 8. The Generator Off signal may also be provided to other voltage generators such as the digit line voltage generator 870 and the plate voltage generator 860 of FIG. 8. Activity 1030 may include permitting the bias voltage transition to ground. Activity 1040 may comprise applying at least one capacitor to the output of the bias voltage generator. This activity will slow the decay of the bias voltage as it transitions to ground. Activity 1050 may comprise applying a time delay to the Generator Off signal. The time delay may be selected to be sufficiently long to allow the storage node voltage to transition to ground before the end of the time delay. Activity 1060 may comprise clamping the bias voltage to ground.

Figure 11:
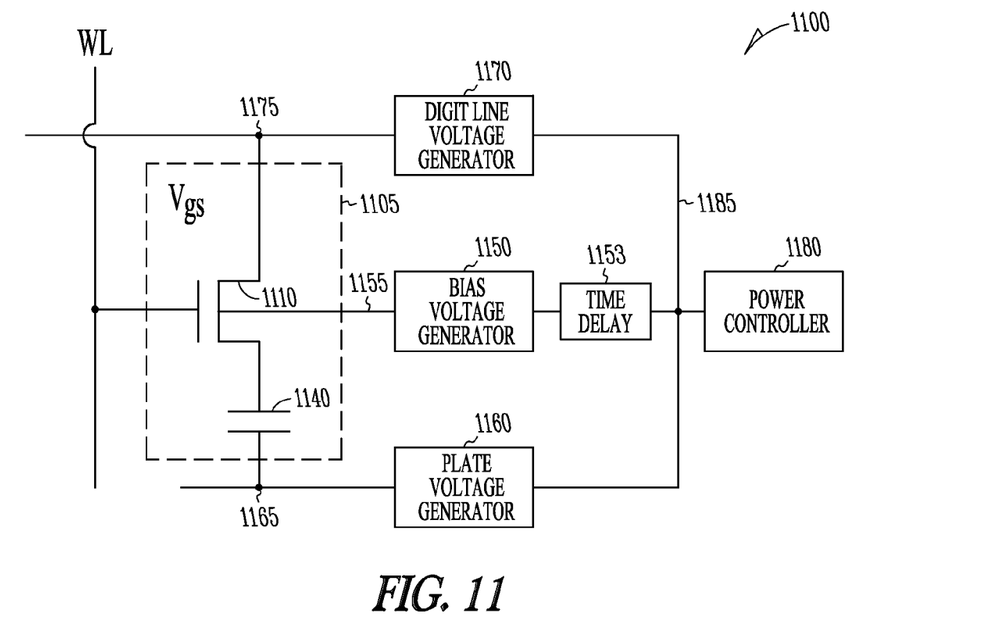
FIG. 11 is a schematic diagram of another bias voltage controller according to an embodiment of the invention.

FIG. 11 is a schematic diagram of another bias voltage controller 1100 according to an embodiment of the invention. The embodiment shown may include a bias voltage generator 1150 to generate a bias voltage 1155, which is applied to a transistor 1110 of a memory cell 1105. Memory cell 1105 may represent one memory cell of an array. The memory cell 1105 may include the transistor 1110 on a substrate and a capacitor 1140. The capacitor 1140 may be connected from a drain of the transistor to a plate voltage 1165. The memory cell 1105 may have a storage node at the drain of the transistor 1110. A plate voltage generator 1160 generates the plate voltage 1165, to be supplied to capacitor 1140. A digit line voltage generator 1170 generates a digit line voltage 1175. A power controller 1180 provides an off signal 1185 to the digit line voltage generator 1170 and plate voltage generator 1160. The off signal from the power controller 1180 may also be provided to a time delay 1153 to delay the time before a Generator Off signal is provided to the bias voltage generator 1150. The time delay 1153 may have a delay that is set to a first time. The first time may be sufficiently great that the storage node voltage will approach zero volts or ground between the time the Generator Off signal is received by both the digit line voltage generator 1170 and the plate voltage generator 1160, until the time delay sends the Generator Off signal to the bias voltage generator 1150.

Figure 12:
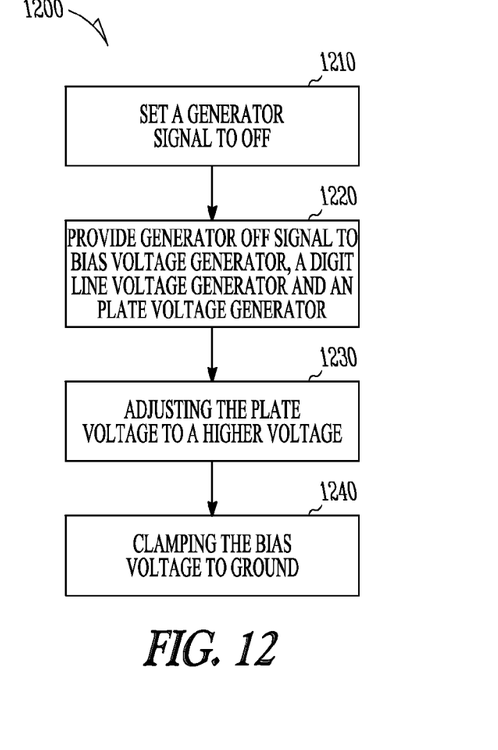
FIG. 12 is a flow diagram of a method of minimizing minority carrier leakage as a DRAM cell enters into the power-off mode according to an embodiment of the invention.

FIG. 12 is a flow diagram 1200 of a method for minimizing minority carrier leakage as a DRAM cell enters into the power-off mode according to an embodiment of the invention. Activity 1210 may comprise setting a generator signal to off at a power controller output. Activity 1220 may comprise providing the generator off signal to a bias voltage generator, a plate voltage generator and a digit line voltage generator. Activity 1230 may comprise adjusting the plate voltage upward to cause the storage node voltage to transition above zero volts. Activity 1240 may comprise clamping the bias voltage to ground. When the plate voltage 1165 is increased, due to the capacitor 1140, the storage node voltage must also transition higher. Once the storage node voltage is greater than zero volts, the bias voltage may not be greater than the storage node voltage unless it transitions above zero volts. Thus, minority carrier leakage is less likely to occur when the storage node voltage is above zero volts. In addition, by clamping the bias voltage to ground, any possibility of the bias voltage floating above zero volts is eliminated.

Figure 13:
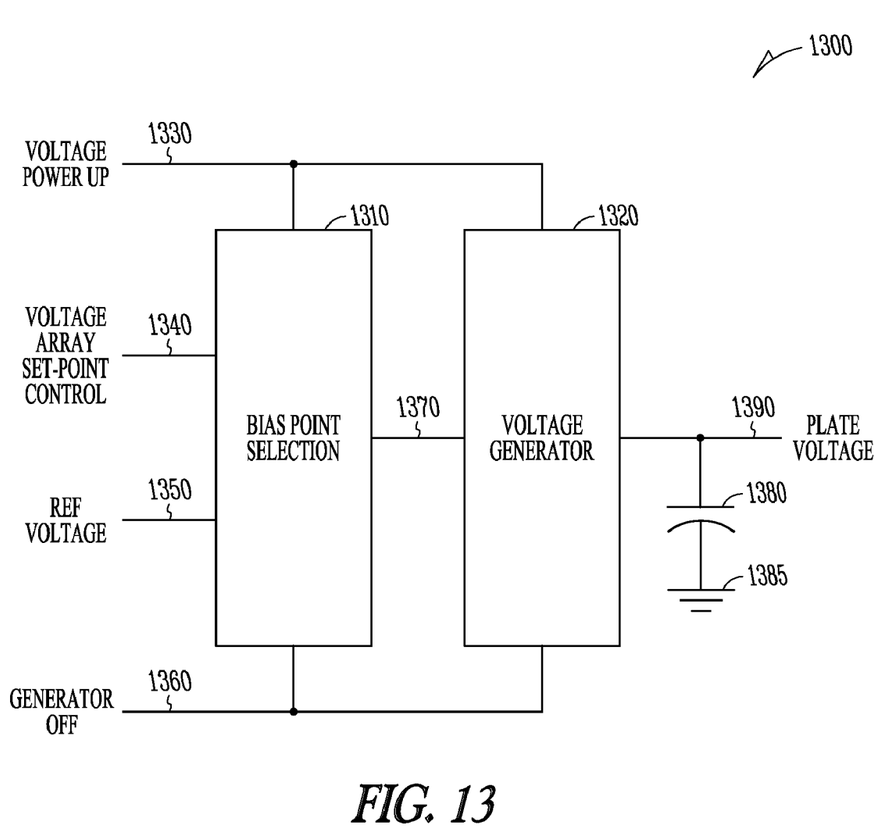
FIG. 13 is a schematic diagram of a power generator according to an embodiment of the invention.

FIG. 13 is a schematic diagram of a power generator 1300 according to an embodiment of the invention. The power generator 1300 receives inputs from a power controller, including a Voltage Power Up input 1330, a Generator Off input 1360, and a reference voltage 1350. The inputs 1330, 1360 are provided to a bias point selection module 1310. The bias point selection module 1310 may control the level at which a plate voltage 1390 will be set. A bias voltage 1370 is provided to a voltage generator 1320. The power up input 1330 is provided to both the bias point selection module 1310 and the voltage generator 1320 to turn the power generator 1300 on. Generator off input 1360 is provided to indicate that the power generator 1300 should turn off. Plate voltage 1390 is stabilized with a capacitor 1380 connected to ground 1385. A plate voltage set-point control 1340 may be used to determine the set-point for the plate voltage 1390. As discussed previously, activity 1230 of FIG. 12 may include adjusting the plate voltage to a higher voltage. Plate voltage set-point control 1340 may provide an input to adjust the plate voltage 1390 upward to move the storage node voltage up to a higher level.

Figure 14:
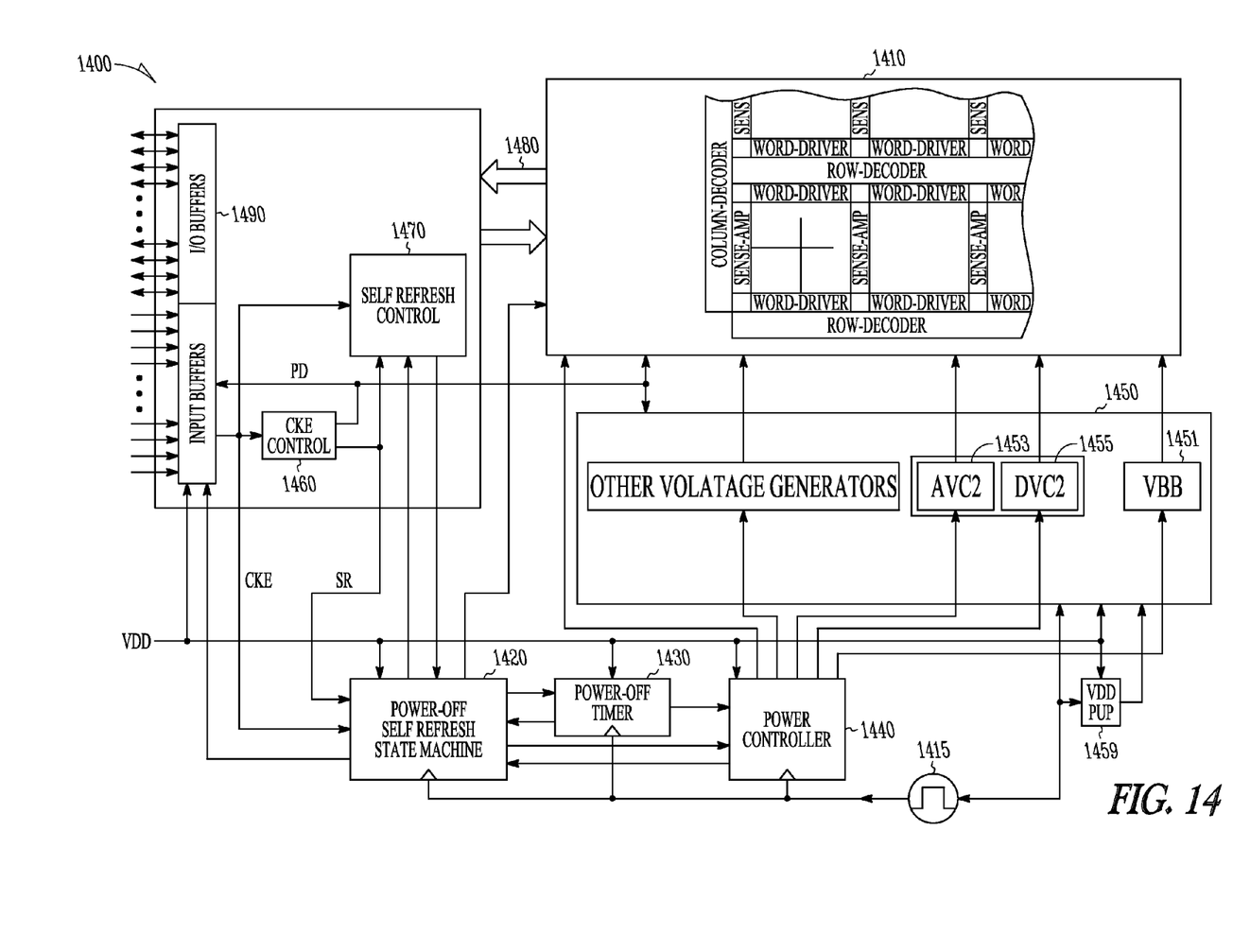
FIG. 14 is a schematic diagram of a DRAM system incorporating an embodiment of the invention.

FIG. 14 is a schematic diagram of a DRAM system 1400 incorporating an embodiment of the invention. DRAM system 1400 comprises a memory array 1410, which may in turn comprise a prior art memory circuit similar to that illustrated in FIG. 2. The memory array 1410 receives power from a power supply 1450, which includes a bias voltage generator 1451, a plate voltage generator 1453, and a digit line voltage generator 1455. Memory array 1410 communicates with input/output buffers 1490 through memory access bus 1480. Power supply 1450 is controlled by a power controller 1440, which receives inputs from clock 1415, power-off timer 1430, and power off self refresh state machine 1420. Inputs and outputs to the system 1400 are provided to input/output buffers 1490. CKE (clock enable) control 1460 indicates whether the DRAM system 1400 is in a non power-off self-refresh mode or a power off self refresh mode. Self-refresh control 1470 controls the DRAM system 1400 when it is in a non power-off self-refresh mode.

Power off self refresh state machine 1420 determines the state of DRAM system 1400. In the power off self refresh state, burst refresh will be utilized to refresh memory array 1410 and power supply 1450 will then power down. In the power off self refresh or sleep state, the DRAM system 1400 may be more prone to minority carrier leakage. The power-off timer 1430 controls how long the power supply 1450 will remain off in the power off self refresh state. The power controller 1440 controls power supply 1450 and may also provide the plate voltage set-point control 1340 discussed in FIG. 13. A universal power up module 1459 may provide the power up signal to turn power supply 1450 on. Clock 1415 may provide a low speed clock signal to the power controller 1440, the power-off timer 1430, the power off self refresh state machine 1420, the power up module 1459 and power supply 1450. Plate voltage generator 1453, digit line voltage generator 1455 and the bias voltage generator 1451 may all be generated in power supply 1450. The combination of signals from power off self refresh state machine 1420 and the power controller 1440 may be utilized to set the system in a power off or sleep state which is preceded by a burst refresh. Embodiments of the invention may be utilized to minimize or eliminate the affects of minority carrier leakage.

Figure 15:
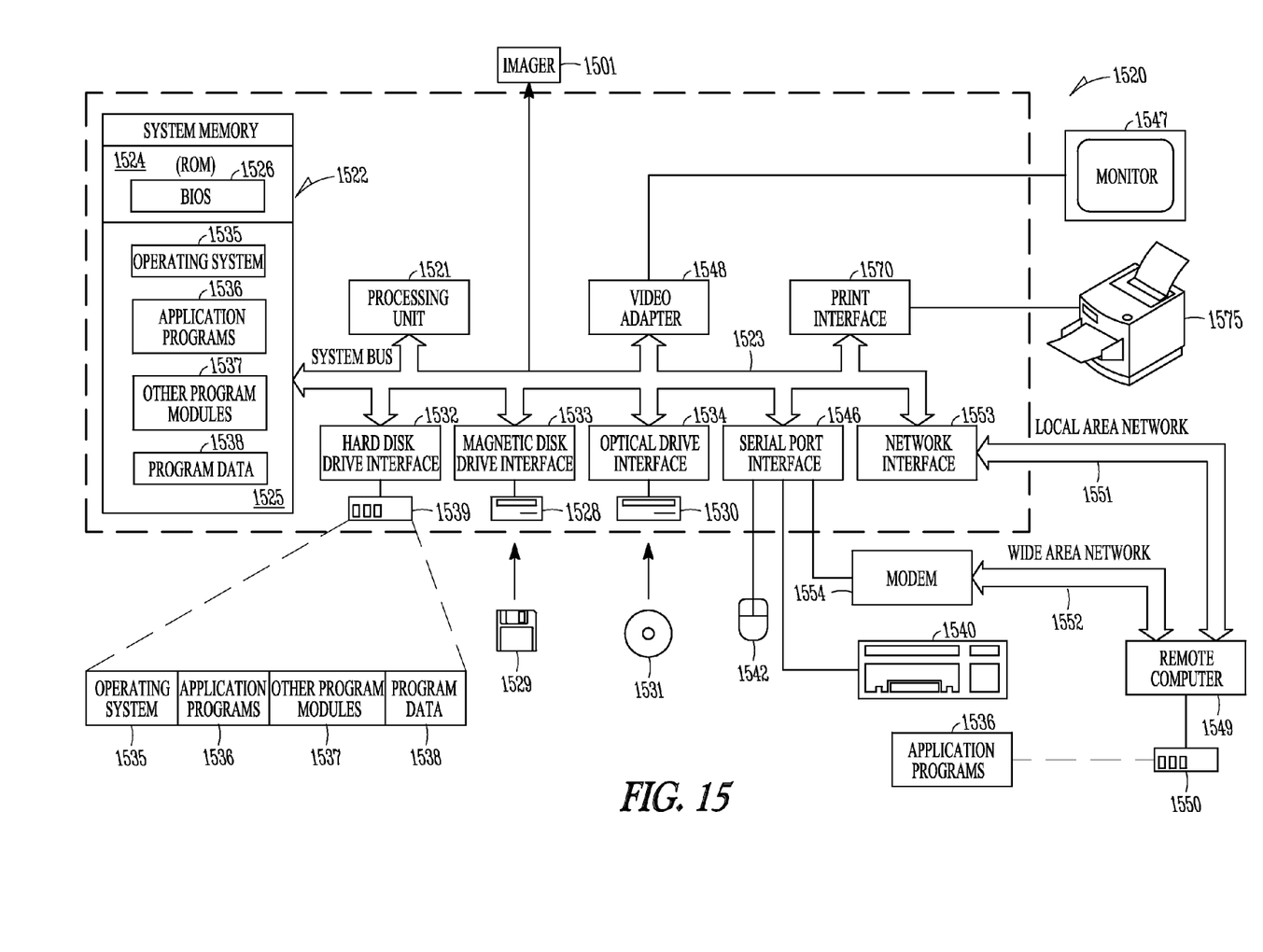
FIG. 15 shows a general-purpose computing device in the form of a personal computer incorporating an embodiment of the invention.

FIG. 15 shows a general-purpose computing device such as a personal computer 1520, which includes a processing unit 1521, a system memory 1522, and a system bus 1523 that couples the system memory 1522 and other system components to processing unit 1521. System bus 1523 may be any of several types, including a memory bus or memory controller, a peripheral bus or a local bus, and may use any of a variety of bus structures. System memory 1522 includes read-only memory (ROM) 1524 and random-access memory (RAM) 1525. RAM 1525 may include DRAM incorporating embodiments of the invention. A basic input/output system (BIOS) 1526, stored in ROM 1524, contains the basic routines that transfer information between components of personal computer 1520. BIOS 1526 may also contain start-up routines for the system.

Personal computer 1520 further includes hard disk drive 1539, magnetic disk drive 1528 for reading from and writing to a removable magnetic disk 1529, and optical disk drive 1530 for reading from and writing to a removable optical disk 1531 such as a CD-ROM (compact disc-read only memory), DVD (digital video disc) or other optical medium. Hard disk drive 1539, magnetic disk drive 1528, and optical disk drive 1530 are connected to system bus 1523 by a hard-disk drive interface 1532, a magnetic-disk drive interface 1533, and an optical-drive interface 1534, respectively. The drives and their associated computer-readable media provide nonvolatile storage of computer-readable instructions, data structures, program modules and other data for personal computer 1520. Although the environment described herein employs a hard disk drive 1539, a removable magnetic disk 1529 and a removable optical disk 1531, those skilled in the art will appreciate that other types of computer-readable media that may store data accessible by a computer may also be used in the operating environment. Such media may include magnetic cassettes, flash-memory cards, DVD, Bernoulli cartridges, RAMs (random access memory), ROMs, and the like.

Program modules may be stored on the hard disk drive 1539, magnetic disk 1529, optical disk 1531, ROM 1524 and RAM 1525. Program modules may include operating system 1535, one or more application programs 1536, other program modules 1537, and program data 1538. A user may enter commands and information into personal computer 1520 through input devices such as a keyboard 1540 and a pointing device 1542. Other input devices (not shown) may include a microphone, joystick, game pad, satellite dish, scanner, or the like. These and other input devices are often connected to the processing unit 1521 through a serial-port interface 1546 (e.g., universal serial bus (USB)) coupled to system bus 1523, but they may be connected through other interfaces not shown in FIG. 15, such as a parallel port, a game port, an Institute of Electrical and Electronics Engineers (IEEE) 1394 port, etc. A monitor 1547 or other display device also connects to system bus 1523 via an interface such as a video adapter 1548. In addition to the monitor, personal computer 1520 may include other peripheral output devices such as printer 1575. A print interface 1570 may be connected to system bus 1523 and to printer 1575.

Personal computer 1520 may operate in a networked environment using logical connections to one or more remote computers such as remote computer 1549. Remote computer 1549 may be another personal computer, a server, a router, a network PC, a peer device, or other common network node. It typically includes many or all of the components described above in connection with personal computer 1520; however, only a remote storage device 1550 is illustrated in FIG. 15. The logical connections depicted in FIG. 15 include local-area network (LAN) 1551 and wide-area network (WAN) 1552.

When placed in a LAN networking environment, personal computer 1520 connects to LAN 1551 through a network interface or adapter 1553. When used in a WAN networking environment such as the Internet, personal computer 1520 typically includes modem 1554 or other means for establishing communications over WAN 1552. Modem 1554 may be internal or external to personal computer 1520, and it may connect to system bus 1523 via serial-port interface 1546. In a networked environment, program modules, such as those comprising Microsoft® Word, which are depicted as residing within personal computer 1520 or portions thereof, may be stored in remote storage device 1550. Of course, the network connections shown are illustrative, and other means of establishing a communications link between the computers may be substituted.

An imager 1501 may be connected to system bus 1523. Embodiments of the invention may be operated by personal computer 1520. Embodiments of the invention may also be incorporated into imager 1501. For example bias controllers 600, 800, 1100 or 1300 may be utilized to minimize or eliminate the affects of minority carrier leakage.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. The above description and figures illustrate embodiments of the invention to enable those skilled in the art to practice the embodiments of the invention. Thus the following claims are hereby incorporated into the Detailed Description, with each claim standing on its own as a separate embodiment.

What is claimed is:

1. An apparatus comprising:
   a memory cell including a storage node, the storage node configured to rise from a storage node voltage to a reference voltage during a mode of the apparatus; and
   a voltage generator coupled to the memory cell and configured to generate a bias voltage less than the reference voltage, the voltage generator configured such that the bias voltage rises to the reference voltage in a second amount of time during the mode of the apparatus, wherein the second amount of time is greater than the first amount of time.

2. The apparatus of claim 1, wherein the memory cell include a capacitor and a transistor coupled to the storage node.

3. The apparatus of claim 1, further comprising a controller to control a rate at which the bias voltage rises to the reference voltage.

4. The apparatus of claim 1, further comprising an additional voltage generator to generate an additional voltage coupled to the memory cell.

5. The apparatus of claim 4, further comprising a capacitor coupled to an output of the additional voltage generator.

6. The apparatus of claim 4, wherein the additional voltage generator is configured such that the additional voltage remains at a higher value than the reference voltage.

7. The apparatus of claim 1, further comprising a clamp to clamp the bias voltage to the reference voltage.

8. The apparatus of claim 7, wherein the claim is configured to clamp the bias voltage to the reference voltage after the storage node voltage reaches the reference voltage.

9. The apparatus of claim 1, wherein the voltage generator is configured such that the bias voltage is less than the storage node voltage when the bias voltage rises to the reference voltage in the mode of the apparatus.

10. The apparatus of claim 1, wherein the reference voltage is approximately zero volts.

11. The apparatus of claim 1, wherein the mode of the apparatus includes a power-off mode.

12. A method, comprising:
    generating a signal associated with a mode of a memory device having a memory cell, the memory cell including a storage node having a storage node voltage, wherein storage node voltage rises to a reference voltage in a first amount of time during the mode of the memory device; and
    raising a bias voltage coupled to the memory cell from a voltage less than the reference voltage to the reference voltage in a second amount of time during the mode of the memory device, wherein the second amount of time is greater than the first amount of time.

13. The method of claim 12, further comprising:
    generating a signal during the mode of the memory device to turn off a power generator of the memory device.

14. The method of claim 12, comprising:
    adjusting the bias voltage such that the bias voltage is less than the storage node voltage during the mode of the memory device.

15. The method of claim 12, further comprising:
    clamping the bias voltage to the reference voltage.

16. The method of claim 12, further comprising:
    controlling a rate at which the bias voltage rises to the reference voltage.

17. The method of claim 12, comprising:
    clamping the bias voltage to the reference voltage after the storage node voltage reaches the reference voltage.

18. The method of claim 12, further comprising:
    generating an additional voltage coupled to the memory cell.

19. The method of claim 18, further comprising:
    maintaining the additional voltage at a higher value than the reference voltage.

20. The method of claim 18, further comprising:
    setting the additional voltage to be higher than half of a supply voltage of the memory device.

* * * * *